US009970780B2

(12) United States Patent
Bai et al.

(10) Patent No.: US 9,970,780 B2
(45) Date of Patent: May 15, 2018

(54) METHOD AND APPARATUS FOR FUEL CONSUMPTION PREDICTION AND COST ESTIMATION VIA CROWD SENSING IN VEHICLE NAVIGATION SYSTEM

(71) Applicant: GM GLOBAL TECHNOLOGY OPERATIONS LLC, Detroit, MI (US)

(72) Inventors: Fan Bai, Ann Arbor, MI (US); David E. Bojanowski, Clarkston, MI (US); Donald K. Grimm, Utica, MI (US); Michael Wagner, Rimbach (DE); Omer Tsimhoni, Bloomfield Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days. days.

(21) Appl. No.: 15/352,011

(22) Filed: Nov. 15, 2016

(65) Prior Publication Data

US 2017/0146362 A1     May 25, 2017

Related U.S. Application Data

(60) Provisional application No. 62/257,551, filed on Nov. 19, 2015.

(51) Int. Cl.
    *G01C 21/36*      (2006.01)
    *G06F 17/11*      (2006.01)
    (Continued)

(52) U.S. Cl.
CPC ..... *G01C 21/3697* (2013.01); *G01C 21/3469* (2013.01); *G01C 21/3476* (2013.01);
(Continued)

(58) Field of Classification Search
CPC ............ G01C 21/3697; G01C 21/3469; G08G 1/0129; G08G 1/0141
(Continued)

(56) References Cited

U.S. PATENT DOCUMENTS

| | | | |
|---|---|---|---|
| 8,793,071 B2 * | 7/2014 | Kim ................... | G01C 21/3469 701/532 |
| 8,972,160 B2 * | 3/2015 | Miura ................ | G01C 21/3697 701/104 |

(Continued)

*Primary Examiner* — Tan Q Nguyen
(74) *Attorney, Agent, or Firm* — John A. Miller; Shumaker, Loop & Kendrick, LLP

(57) ABSTRACT

A system and method for providing navigation routing options to a vehicle driver, including estimated fuel consumption and fuel cost. A server collects data from a large number of road vehicles driving different routes, where the data includes road grade, average speed, stop/start and acceleration/deceleration info and vehicle specifications, and the data is collected via a telematics or other wireless system. The server also receives map data, point of interest data and real-time traffic data from their respective providers. When a driver of a road vehicle requests navigation routing from a start point to a destination, the server provides multiple routing options including not only distance and time for each routing option, but also fuel consumption and cost. The estimated fuel consumption is computed using models based on the crowd-sensed data from the other vehicles driving the routes, where the models include a physics-based model and a machine learning model.

25 Claims, 5 Drawing Sheets

(51) Int. Cl.
  *G01C 21/34* (2006.01)
  *G06F 17/50* (2006.01)
  *G06N 3/04* (2006.01)
  *G06N 3/08* (2006.01)
  *G07C 5/00* (2006.01)
  *G08G 1/01* (2006.01)
  *G08G 1/0968* (2006.01)

(52) U.S. Cl.
  CPC .......... *G01C 21/3492* (2013.01); *G06F 17/11* (2013.01); *G06F 17/5009* (2013.01); *G06N 3/04* (2013.01); *G06N 3/08* (2013.01); *G07C 5/008* (2013.01); *G08G 1/0112* (2013.01); *G08G 1/0129* (2013.01); *G08G 1/0141* (2013.01); *G08G 1/09685* (2013.01); *G08G 1/096816* (2013.01)

(58) Field of Classification Search
  USPC ........................................................ 701/123
  See application file for complete search history.

(56) References Cited

U.S. PATENT DOCUMENTS

| | | | |
|---|---|---|---|
| 9,046,379 B2* | 6/2015 | Mineta | G01C 21/3469 |
| 9,068,848 B2* | 6/2015 | Kluge | G01C 21/34 |
| 9,239,243 B2* | 1/2016 | Engelhardt | G01C 21/32 |
| 2007/0021909 A1* | 1/2007 | Matsuda | G01C 21/165 |
| | | | 701/532 |
| 2008/0221787 A1* | 9/2008 | Vavrus | G01C 21/3469 |
| | | | 701/423 |
| 2009/0048770 A1* | 2/2009 | Sato | G01F 9/008 |
| | | | 701/123 |
| 2010/0088012 A1* | 4/2010 | O'Sullivan | G01C 21/3469 |
| | | | 701/532 |
| 2010/0250114 A1* | 9/2010 | Chikamori | G01C 21/3461 |
| | | | 701/533 |

* cited by examiner

METHOD AND APPARATUS FOR FUEL CONSUMPTION PREDICTION AND COST ESTIMATION VIA CROWD SENSING IN VEHICLE NAVIGATION SYSTEM

CROSS-REFERENCE TO RELATED APPLICATIONS

This application claims the benefit of the priority date of U.S. Provisional Patent Application Ser. No. 62/257,551, titled, Method and Apparatus for Fuel Consumption Prediction and Cost Estimation Via Crowd-Sensing in Vehicle Navigation System, filed Nov. 19, 2015.

BACKGROUND OF THE INVENTION

Field of the Invention

This invention relates generally to a vehicle navigation system and, more particularly, to a system and method for providing navigation routing options to a vehicle driver or autonomous vehicle navigation system, where the navigation routes offered by the system each include an estimated fuel consumption and fuel cost, and where the estimated fuel consumption is computed using models based on crowd-sensed data from other vehicles driving the routes.

Description of the Related Art

Navigation systems have become increasingly popular with vehicle drivers in recent years, as the functionality and reliability of such systems have improved dramatically. Many new vehicles include a navigation system delivered as original equipment by the vehicle manufacturer, which is typically integrated with a telematics system and vehicle audio/visual systems. Other types of navigation systems include stand-alone devices which can be purchased and simply placed in a vehicle, and even smart phones equipped with navigation application software. With all of these types of navigation systems, route planning, visual map display and turn-by-turn driver guidance are available. Collectively, these features have made navigation systems virtually indispensable to many drivers.

In any of the navigation systems described above, a driver can request navigation instructions for driving from a starting point to a destination. Most navigation systems have the capability to offer more than one route from the starting point to the destination. For example, a navigation system might offer three different routes to the destination, where one route includes only high-speed-limit roadways but has a greatest distance, a second route features the shortest distance but involves mostly low-speed roads and streets, and a third route includes speed limits and distances which are in between the first two route options. Existing navigation systems typically estimate the total driving distance and the amount of time it will take to drive each of the optional routes. While all of these features are helpful, drivers and/or autonomous driving systems can benefit from additional information about navigation routing options which may help the driver or system determine which route to take.

SUMMARY OF THE INVENTION

In accordance with the teachings of the present invention, a system and method are disclosed for providing navigation routing options to a vehicle driver or autonomous driving system, where the navigation routes offered by the system each include an estimated fuel consumption and fuel cost. A server collects data from a large number of road vehicles driving different routes, where the data includes road grade, average speed, stop/start and acceleration/deceleration, elevation (height above sea level), and outside air temperature and related weather info and vehicle specifications, and the data is collected via a telematics system or other wireless transmission. The server also receives map data, point of interest data and real-time traffic data from their respective providers. When a driver of a road vehicle requests navigation routing from a start point to a destination, the server provides multiple routing options including not only distance and time for each routing option, but also fuel consumption and cost. The estimated fuel consumption is computed using models based on the crowd-sensed data from the other vehicles driving the routes, where the models include a physics-based model and a machine learning model.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for providing fuel consumption prediction and fuel cost estimation in a vehicle navigation system is merely exemplary in nature, and is in no way intended to limit the invention or its applications or uses. For example, the embodiments discussed below are described in the context of a driver using an in-vehicle navigation system; however, the inventive concept of calculating and providing fuel consumption data for various routing alternatives is equally applicable to web-based map programs which are accessed via computers or handheld mobile devices. The concept is also applicable to autonomous driving systems that perform automatic re-routing functions and select a route autonomously or based on input preferences from the vehicle administrator or occupant.

Navigation systems are well known in the art which provide route planning, visual map display and turn-by-turn driver navigation guidance. When a driver requests navigation instructions for driving from a starting point to a destination, most navigation systems have the capability to offer more than one route option, and basic distance and time estimates are provided for each route option. There are some situations where a navigation system offers only one route option, as only one routing makes sense, but in many other situations, more than one route option is offered.

Figure 1:
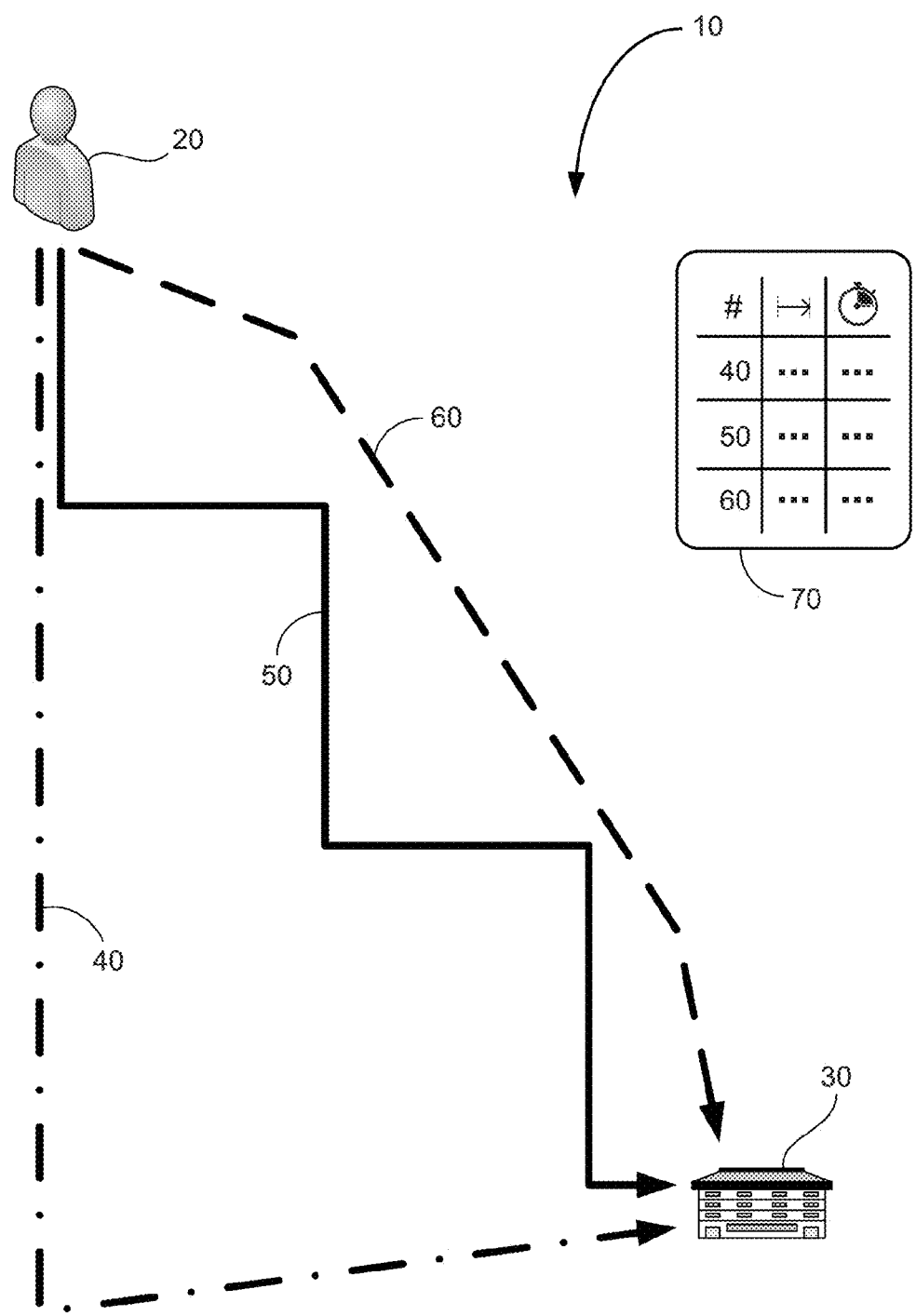
FIG. 1 is an illustration of a display from a typical navigation system, showing three possible routes from a start point to a destination, with a distance and time associated with each route.

FIG. 1 is an illustration of a display 10 from a typical in-vehicle navigation system, such as is known in the art. The display 10 represents a scenario where a driver has requested navigation instructions from a start point 20 to a destination 30. The start point 20 typically defaults to the current location of the vehicle and driver, but could be anywhere. The display 10 shows three possible routes from the start point 20 to the destination 30, including a route 40, a route 50 and a route 60. The route 40 entails the longest driving distance of the three routing options, but may include all highway driving with few or no stops. The route 60 entails the shortest driving distance, but may include low-speed driving and frequent stops at stop signs and stop lights. The route 50 has an intermediate driving distance (shorter than the route 40 but longer than the route 60), and may include moderate travel speeds.

Because of the different characteristics of the routing options, it is known for navigation systems to provide the driver with a distance and time associated with each route. A table 70 includes, for each of the routes 40/50/60, a total distance and an estimated time. Of course, the distance and time may be displayed to the driver in a form other than the table 70—such as a side note appended to each of the routes 40/50/60. The time estimate and distance data may help the driver decide which route to take. However, using the systems and methods discussed below, more information can be provided to the driver to help the driver make a more informed decision as to which route to travel.

Figure 2:
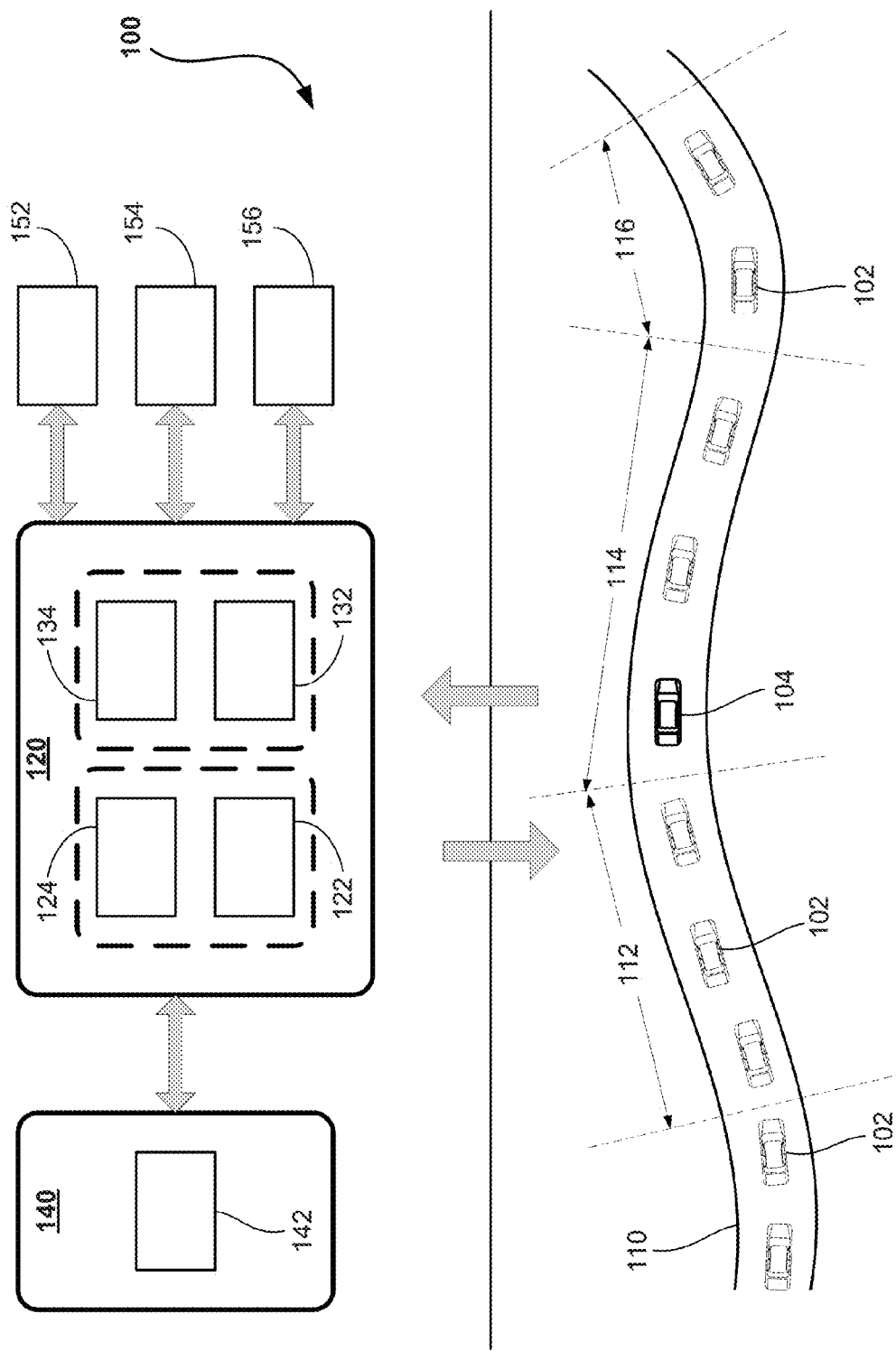
FIG. 2 is a block diagram illustration of a system framework for collecting crowd-sensed vehicle driving data and other data, and computing estimated fuel consumption for requested navigation routes.

FIG. 2 is a block diagram illustration of a system framework 100 for collecting crowd-sensed vehicle driving data and other data, and computing estimated fuel consumption for requested navigation routes. As shown in FIG. 2, a plurality of vehicles 102 are shown driving on a roadway 110. The roadway 110 is divided into road segments 112, 114, 116, etc., where the road segments are typically determined by map providers, and each segment is a fairly short stretch of road having consistent attributes and characteristics. For example, a road segment in a residential neighborhood might be one block long, where the road has constant number of lanes and speed limit for the entire segment. On a highway, number of lanes, speed limit, entrance/exit ramps, road grade and road curvature may all be used to determine the extent of each road segment.

Although only the roadway 110 is shown in FIG. 2, in an actual implementation of the framework 100, a large number of the vehicles 102 would be driving on many different roadways. A vehicle 104 will request navigation instructions, as discussed below.

The vehicles 102 and 104 wirelessly communicate with a server 120. The wireless communications between the vehicles 102/104 and the server 120 may use any suitable technology—including but not limited to, proprietary telematics systems, cellular communications, satellite communications, vehicle-to-vehicle (V2V) and vehicle-to-infrastructure (V2I) communications using dedicated short range communications (DSRC) or other technology, etc. Further, the communications between the vehicles 102/104 and the server 120 may pass through various Internet routes, proprietary communications networks and servers, and other intermediate routing devices. In the framework 100, it is simply necessary for the vehicles 102/104 to be able to communicate in a two-way fashion with the server 120 in real-time or near real-time.

Of course, not every vehicle on any road will be in communication with the server 120, as many vehicles will not be so equipped. The server 120 will collect data from as many vehicles as possible for all roadways within its purview and, if more vehicles are providing data than the server 120 needs to maintain good quality fuel consumption models, then the server 120 will selectively receive data from a preferred number of vehicles.

The server 120 includes computational capability and storage capability, as would be understood by anyone familiar with computers. The server 120 is programmed with at least one of two different types of fuel consumption prediction models—a physics-based model, and a machine learning model. A data collection module 122 collects data from the vehicles 102 for a physics-based model 124, and a data collection module 132 collects data from the vehicles 102 for a machine learning model 134. The data collected by the data collection modules 122 and 132 may be slightly different, and the data collection and the models are discussed in detail below.

One or more vehicle-manufacturer-private servers 140 provide proprietary vehicle model data 142 to the server 120, and may also receive data back from the server 120. The vehicle model data 142 may be used in the physics-based model 124 and/or the machine learning model 134 to estimate fuel consumption by the vehicle 104, as will also be discussed further below.

External data providers 152/154/156 provide data to the server 120 for use in the fuel consumption models. The external data providers 152/154/156 include a point-of-interest (POI) data provider 152 with fuel station location data being of primary interest, a map data provider 154 and a real-time traffic data provider 156. Other types of external data may also be provided, to improve the fuel consumption prediction (e.g., current weather and forecasted weather information). Communications between the server 120 and the external data providers 152/154/156 may be two-way in nature, as the server 120 may collect data from the vehicles 102 which is more accurate and/or more current than data possessed by the external data providers 152/154/156.

To summarize the framework 100, the server 120 continuously collects data from many road vehicles 102 and other data sources (142, 152-156), and continuously refines fuel consumption estimation models 124 and 134. When the vehicle 104 requests navigation routing instructions, the server 120 provides at least one (and often more than one) routing option, including distance, estimated time, and estimated fuel consumption and cost for each of the routing options. Following is a discussion of how the models 124 and 134 operate.

As the name implies, the physics-based model 124 uses calculations based on engine performance, vehicle parameters and vehicle environment to estimate fuel consumption for a particular vehicle and driver over the road segments of a particular navigation route. When reduced to first principles, the motion of the vehicle 104 (or any vehicle which is the subject of the fuel consumption calculations) is characterized by Newton's second law, which states that the sum of the forces acting on the vehicle 104 is equal to its mass times its acceleration. When extended to include other equivalent forces which affect fuel consumption, Newton's second law equation can be written as:

$$m\frac{dv}{dt} = F_{eng} - F_{fric} - F_{grav} - F_{aero} - F_{idle} - F_{elec} - F_{brake}, \quad (1)$$

where m is the mass of the vehicle 104, $$\frac{dv}{dt}$$

is the vehicle acceleration (rate of change of longitudinal velocity), $F_{eng}$ is the force provided by the vehicle engine, $F_{fric}$ is the road friction force, $F_{grav}$ is the force of gravity acting longitudinally on the vehicle (if there is a road slope), $F_{aero}$ is the aerodynamic drag force on the vehicle, $F_{idle}$ is the equivalent force acting on the vehicle associated with stops and starts along the roadway, $F_{elec}$ is the equivalent force associated with the vehicle electrical system, and $F_{brake}$ is the braking force.

Each of the forces in Equation (1) can be modeled using a combination of vehicle parameters, engine parameters, roadway and driver parameters and empirical data. Specifically, the forces may be modeled as follows:

$$F_{eng} = k_0 \frac{\eta \cdot \gamma \cdot \gamma_{final}}{R_{wheel}} T, \qquad (2)$$

where $F_{eng}$ is forward force (thrust) on the vehicle due to the engine, $k_0$ is a constant, $\eta$ is engine efficiency, $\gamma$ is transmission efficiency, $\gamma_{final}$ is final drive efficiency, T is engine torque, and $R_{wheel}$ is wheel radius. Using an engine model, a fuel consumption associated with a particular engine force $F_{eng}$ can be determined.

Continuing through the force terms of Equation (1):

$$F_{fric} = k_1 m \cos \alpha (r_0 + r_1 v) \qquad (3)$$

where $F_{fric}$ is friction force on the vehicle from the road, $k_1$ is a constant, m is vehicle mass, a is road grade, $r_0$ is a road friction resistance value, $r_1$ is a rolling resistance coefficient, and v is vehicle velocity.

Continuing through the force terms of Equation (1):

$$F_{grav} = k_2 mg \sin \alpha, \qquad (4)$$

where $F_{grav}$ is a longitudinal component of gravity force on the vehicle due to road grade, $k_2$ is a constant, m is vehicle mass, g is acceleration of gravity, and $\alpha$ is road grade.

Continuing through the force terms of Equation (1):

$$F_{aero} = k_3 \tfrac{1}{2} \rho A C_d v^2, \qquad (5)$$

where $F_{aero}$ is aerodynamic drag force on the vehicle, $k_3$ is a constant, $\rho$ is air density, A is frontal area of the vehicle, $C_d$ is a drag coefficient based on shape of the vehicle, and v is vehicle velocity.

Continuing through the force terms of Equation (1):

$$F_{idle} = k_4 m v^2 \left( \frac{ST + TL}{dist} \right), \qquad (6)$$

where $F_{idle}$ is an equivalent force on the vehicle associated with idling, $k_4$ is a constant, m is vehicle mass, v is vehicle velocity, and ST+TL is number of stop signs and traffic lights encountered per unit distance dist over the road segment.

Continuing through the force terms of Equation (1):

$$F_{elec} = k_5 p_e, \qquad (7)$$

where $F_{elec}$ is an equivalent force on the vehicle associated with electrical system energy consumption, $k_5$ is a constant, and $p_e$ is an electrical system loss coefficient.

For the final term of Equation (1), $F_{brake}$ is braking force on the vehicle, which may be determined by longitudinal acceleration or by sensors in a brake system such as an anti-lock braking system. In vehicles with a regenerative braking system where some braking torque is captured as kinetic or electrical energy, this can be accounted for in the model so that the braking force $F_{brake}$ is not treated as pure wasted energy.

Some of the parameters which appear in Equations (1)-(7) may vary from one driving trip to another for the individual vehicle 104. For example, the vehicle mass m will be significantly different if the vehicle 104 has only the driver onboard, versus being fully loaded with 5-6 adult passengers, or loaded with heavy cargo. Likewise, a pickup truck with bulky cargo in the bed, or pulling a trailer, will have a higher mass and a higher drag coefficient than the standard vehicle. Adjustment of these parameters to the configuration of the current driving trip can be accomplished by a combination of measurement and learning techniques—where, for example, vehicle mass may be directly measurable through load sensors in the suspension, and drag coefficient may be learned by calculations made while driving on a level road at a constant speed.

The physics-based model 124 can be constructed using Equations (1)-(7), such that a vehicle's fuel consumption can be calculated for any given road segment. This is done by modeling a vehicle dynamic profile—accelerations, decelerations, stop, starts and road grade climbs—over the course of each road segment, using the crowd-sensed and vehicle/driver-specific data described above. Once the vehicle dynamic profile is modeled, transmission gear selection and therefore engine speed can also be predicted for the drive along the road segment. The engine torque profile (vs. time) is also available from Equation (1), including torque needed to move the vehicle and other sources of drag and inefficiency for the road segment (Equations (3)-(7)). Thus, a time-based simulation of engine speed and torque over the duration of the road segment drive is now available. Using the engine torque and speed time profile, fuel consumption as a function of time can be written as:

$$f(t) = C \cdot W(t) \cdot T(t), \qquad (8)$$

where f(t) is fuel consumption as a function of time, C is a calibration constant, W(t) is engine speed as a function of time, and T(t) is engine torque as a function of time.

With fuel consumption modeled as a function of time as shown in Equation (8), total fuel consumption $F_i$ for a road segment i can be computed as:

$$F_i = \int_{t=0}^{T} f(t) dt. \qquad (9)$$

The constants k in Equations (2)-(7) can be determined to provide the best correlation to actual fuel consumption data for a large number of vehicles, where the actual fuel consumption data is also crowd-sensed from the vehicles 102. Once the physics-based model 124 is correlated to actual road data for a large number of the vehicles 102, the model 124 can be used in a predictive manner to estimate fuel consumption for any particular vehicle 104 driving over any particular road segment.

In the past, it was not possible to use Equations (1)-(7) to accurately estimate fuel consumption in advance for a planned driving route, because many of the parameters in Equations (2)-(7) were not available a priori for the calculations. For example, the road grade a, the traffic flow speed v, individual acceleration/braking patterns and deviation from average traffic speed, and idling caused by stop signs and traffic lights would typically not be known for any arbitrary navigation route which may be requested. However, using the framework 100 discussed above, all of this data and more may be crowd-sensed from the vehicles 102 or determined for the individual vehicle 104, and used in the physics-based model 124 for fuel consumption estimation.

Figure 3:
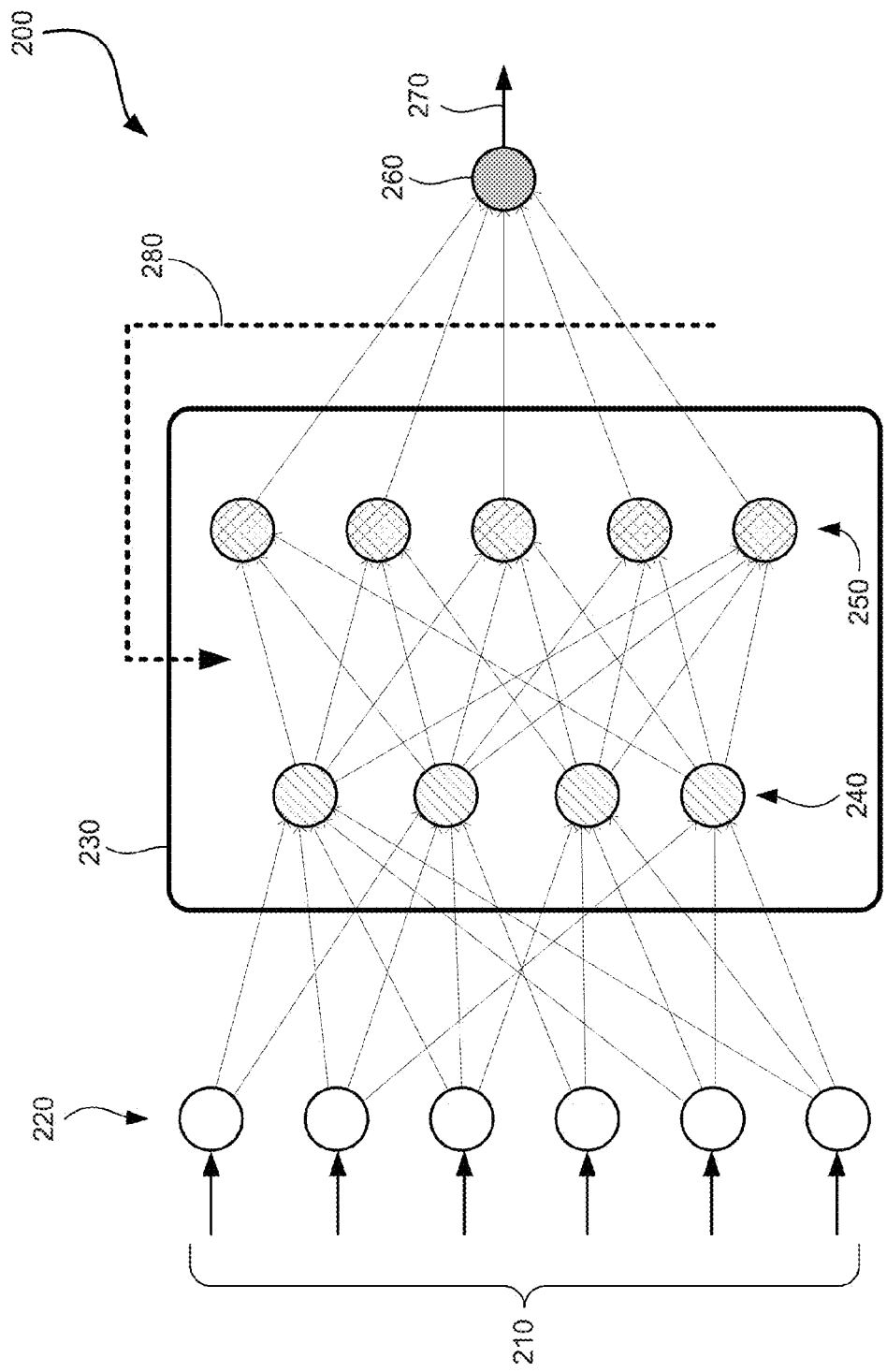
FIG. 3 is an illustration of a neural network model used to estimate fuel consumption based on a number of road topology and driver behavior parameters.

FIG. 3 is an illustration of a neural network model 200 used to estimate fuel consumption based on a number of road topology and driver behavior parameters. The neural network model 200 is one type of model which may be used as the machine learning model 134. Other types of machine learning models may also be used, as would be understood by those skilled in the art.

The neural network model 200 uses machine learning techniques to build a model which relates a number of input parameters 210 to an output parameter 270. Unlike the physics-based model 124, the neural network model 200 (or any machine learning model 134) does not model the physics of vehicle forces and motions, but rather uses numerical techniques to optimize the correlation between a set of input parameters and an output parameter. The input parameters 210 are similar to the inputs used in the physics-based model 124. In one embodiment, eight of the input parameters 210 are used, including road grade in the form of altitude of the end of a road segment relative to altitude of the start of the segment, total ascent distance (vertical), total descent distance (vertical), average speed, average absolute acceleration, number of stops, total stop duration and number of large accelerations. In another embodiment, actual elevation (height above sea level; not just relative climb/descent for a road segment) and outside air temperature are included as inputs. Other combinations of the input parameters 210 could of course be used. The intention is that the input parameters 210 include the factors which are most significant in determining fuel consumption of a vehicle driving over a road segment.

It is noted that some of the input parameters 210 are related to road topology—for example, the altitude, ascent and descent parameters. Others of the input parameters 210 correlate to driver behavior—such as acceleration data. Still others of the input parameters 210 may relate to a combination of road topology, driver behavior and traffic conditions—such as average speed, and number of stops. This is much the same as the parameters used as inputs in the physics-based model 124.

The input parameters 210 are provided to an input layer of nodes 220, as shown. An adaptive model core 230 includes, in this case, two layers of internal nodes—a first internal layer 240 and a second internal layer 250. The second internal layer 250 connects with an output layer 260 having a single node, which represents the output parameter 270—in this case, fuel consumption.

The neural network model 200 is first operated in a training mode in which a large number of data sets are provided, where each of the training data sets includes not only the input parameters 210 but also the output parameter 270 (actual fuel consumption) for a driven road segment. During the training mode, the model 200 constructs itself to provide the best possible correlation between the input parameters and the output parameter for each training set. The number of layers in the adaptive model core 230, the number of nodes in each of the layers 240 and 250, and the connectivity between the layers 220, 240, 250 and 260 are all varied during training mode to achieve the best correlation. A back propagation channel 280 represents the feedback used for adaptive model training.

After a sufficient number of data sets are provided for the training mode, and the neural network model 200 demonstrates good correlation of model-computed fuel consumption with actual fuel consumption, then the model 200 is ready to be used in a testing mode. In the testing mode, the model 200 is used to predict fuel consumption for a vehicle (the vehicle 104) which is planning to drive a particular road segment—or more particularly, a navigation route made up of many road segments. In the testing mode, the input parameters 210 are obtained from a combination of crowd-sensing data, data about the vehicle 104 and its driver, map data and real-time traffic data. Some parameters about the vehicle 104 or its driver may need to be adjusted specifically for the current driving trip, in the manner discussed above. With all of the input parameters 210 being available from these sources, and the neural network model 200 having been previously trained, the model 200 can be used to predictively estimate fuel consumption for a particular vehicle, driver and road segment.

Many different machine learning techniques are known in the art and may be suitable for the machine learning model 134 including the neural network model 200—such as support vector machine (SVM) regression with a radial basis function (RBF) kernel. Anomaly (outlier) detection, regularization and cross-validation are also considered to improve accuracy. Other statistical learning methods, such as Bayesian network analysis, could be used to achieve this goal as well.

Figure 4:
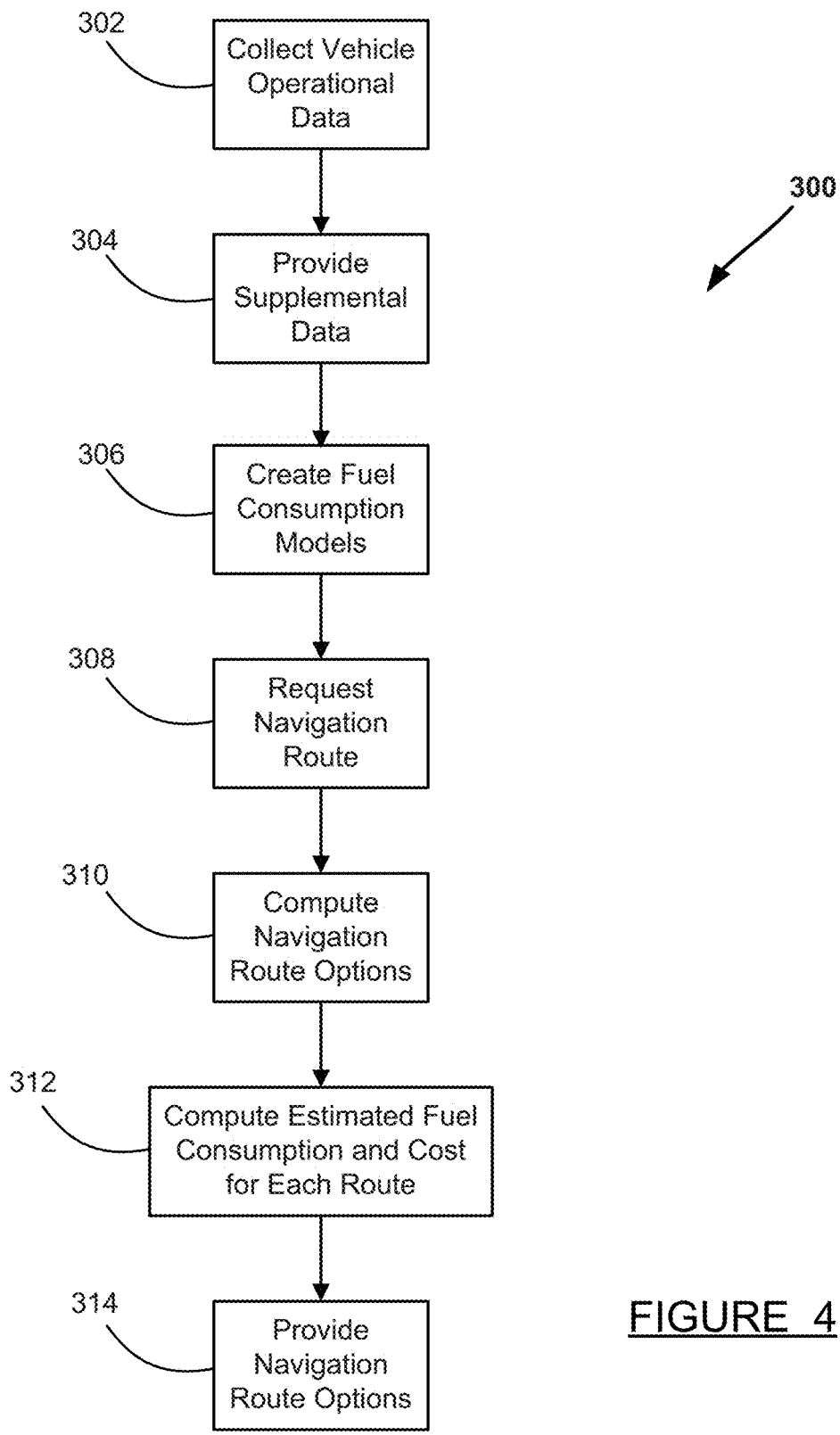
FIG. 4 is a flowchart diagram of a method for providing fuel consumption prediction and fuel cost estimation in a vehicle navigation system.

FIG. 4 is a flowchart diagram 300 of a method for providing fuel consumption prediction and fuel cost estimation in a vehicle navigation system, using the data collection and modeling techniques described above.

At box 302, vehicle operational data is collected from a plurality of vehicles driving on a plurality of road segments. This crowd-sensed data is collected by a server in "the cloud" (the server 120)—which may be anywhere on the Internet, or may be a server which is privately operated by a vehicle manufacturer with a proprietary telematics system, or any other server with remote data collection capability. The data collected at the box 302 is preferably collected wirelessly and continuously from the plurality of vehicles. The vehicle operational data collected at the box 302 includes all of the input parameters listed previously for the physics-based model 124 and the machine learning model 134, as well as the actual fuel consumption for the vehicles 102 driving different road segments. The actual fuel consumption data is used to calibrate and correlate the models 124 and 134, as described above.

At box 304, supplemental data is provided to the server computer 120 by a point of interest data provider 152, a map data provider 154 and a real-time traffic provider 156. The data collected from the supplemental data providers 152/154/156 at the box 304 includes: road map data (road segments, including road surface type, number of lanes, curvature, intersections, etc.); point of interest (POI) data, including locations of fuel stations, and hours of operation, prices, fuel type availability, etc. for the stations; and real-time traffic data, including average speeds where below posted speed, locations of road construction and accidents, etc. It is noted that providing the supplemental data at the box 304 is not mandatory, as the server 120 may already have map and POI data, and crowd-sensed data from the vehicles 102 can take the place of real-time traffic data.

At box 306, fuel consumption models are created on the server 120 for the road segments. The fuel consumption models take into account many factors, including road grade, average speed, traffic congestion, number of stop lights and stop signs, vehicle and engine type, driver acceleration/braking patterns, etc., as discussed previously. The fuel consumption models may include the physics-based model 124, the machine learning model 134, or both. The models 124/134 estimate fuel consumption for a planned driving route based on not only the road-specific factors, but also the vehicle-specific and driver-specific factors—such as vehicle mass, engine and transmission specifications, acceleration and braking characteristics, etc. As described above, the fuel consumption models 124/134 created at the box 306 are first computed and calibrated using known fuel consumption data for many vehicles driving many different road segments, then the models 124/134 are ready to be used in a predictive mode.

At box 308, a navigation route is requested by a driver. The request would be made in a typical fashion through the onboard vehicle navigation system in the vehicle 104 of FIG. 2, where the driver specifies a start point (often the vehicle current location) and a destination.

At box 310, the server 120 computes one or more navigation route options for the requested navigation route. The route options typically include two or three different routes including at least some differences in roads. After determining the navigation route options, at box 312 the server 120 computes estimated fuel consumption and fuel cost for each of the routes using the model or models. The fuel consumption estimate may be based on the physics-based model 124, or the machine learning model 134, or a combination of the two. The fuel cost is computed based on fuel consumption along a route and fuel price at filling stations which are located along the route.

At box 314, the navigation route options are provided to the driver via the in-vehicle navigation system, where the route options each include not only distance and time, but also fuel consumption and fuel cost as computed using the models 124/134. The route options presented to the driver may also include, especially for long-distance navigation routes, locations of fuel stations relative to driving range along each route option—so that it is readily apparent to the driver whether refueling can be conveniently completed along any chosen route.

The process described above may also include providing proprietary data from a vehicle manufacturer to be used in the model-based fuel consumption prediction. For example, the proprietary data may include powertrain performance data for a particular model of vehicle.

The process described above may further include providing feedback data from the server computer 120 back to the point of interest data provider 152, the map data provider 154 and the real-time traffic provider 156. For example, a driver may be able to report a price paid at a fuel station, or an actual driven road segment may be different in some way than indicated in the map data, or a driver may experience traffic congestion conditions which are different (better or worse) than those being reported by the real-time traffic provider 156. Any data which is experienced by the vehicles 102 and/or 104 and provided to the server 120, and which is different than what is provided by the supplemental data providers 152/154/156, is subject to update.

Finally, it is also conceivable to run the process described above on a local processor onboard individual vehicles such as the vehicle 104. This can be done by downloading either the physics-based fuel consumption model 124 or the machine learning model 134, or both, to connected vehicles. Model downloads could be performed on a periodic (push) basis, or on an as-needed (pull) basis when a navigation route is being requested. Then, when a driver wants to plan a route, the in-vehicle navigation system could provide not only the different routings with time and distance, but also estimated fuel consumption and fuel cost based on calculations performed locally in the vehicle using the models 124/134.

As will be well understood by those skilled in the art, the several and various steps and processes discussed herein to describe the invention may be referring to operations performed by the server 120, another computer, a processor or other electronic calculating device that manipulate and/or transform data using electrical phenomenon. The vehicles 102 (crowd-sourced data providers) and 104 (individual vehicle requesting navigation routing) are understood to have onboard processors and memory for collecting data and making calculations, and communications systems for wirelessly communicating with the server 120. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

Figure 5:
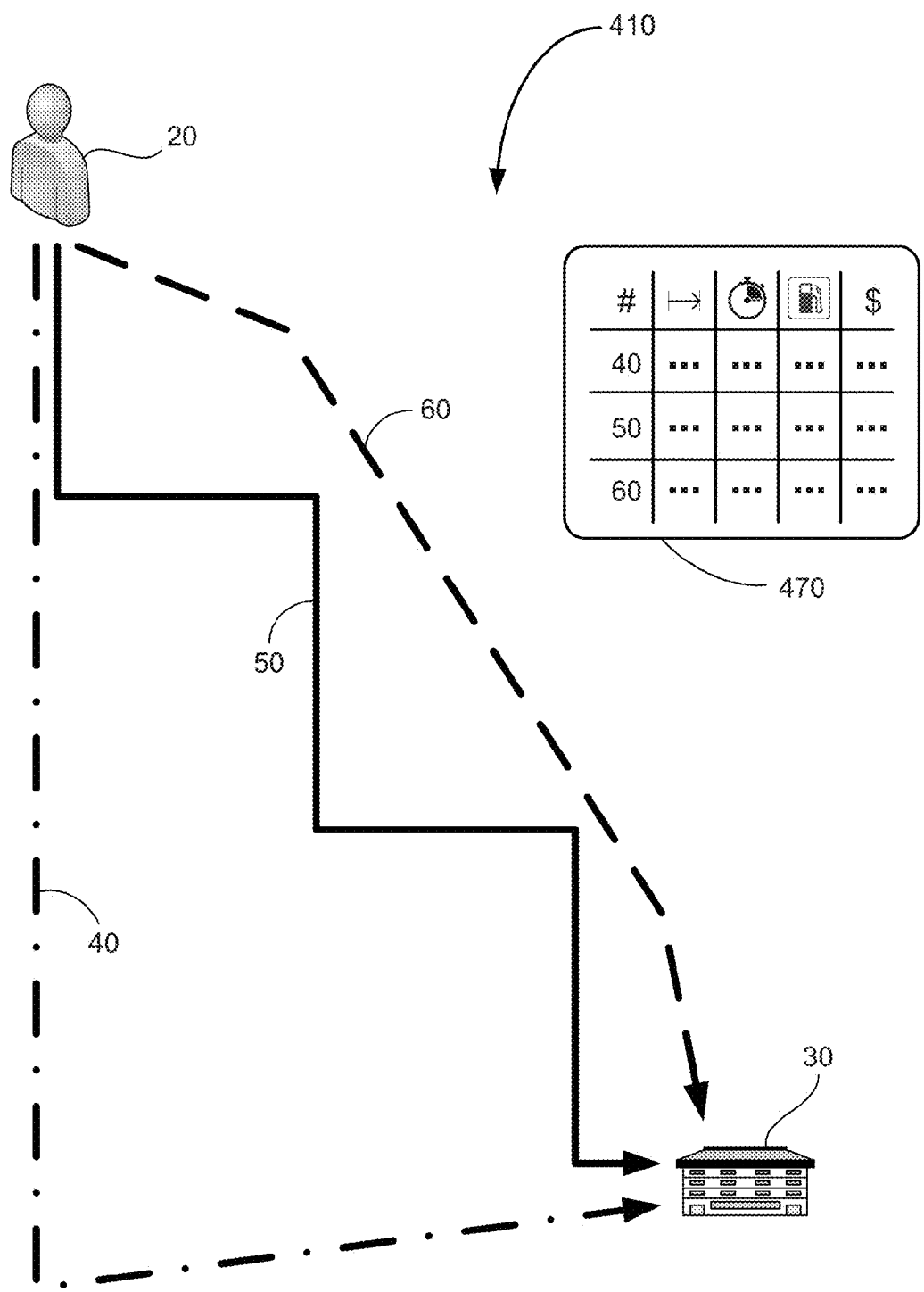
FIG. 5 is an illustration of a display from a navigation system according to an embodiment of the disclosed invention, showing the three navigation routes and data as in FIG. 1, and also including fuel consumption and cost for each route.

FIG. 5 is an illustration of a display 410 from a navigation system according to an embodiment of the disclosed invention. The display 410 includes a table 470 showing the three navigation routes 40/50/60 and distance and time data as in FIG. 1. The table 470 also includes fuel consumption and cost for each route, computed as described in detail above. It is expected that many drivers will select the route which will consume the least amount of fuel or which has the lowest fuel cost, particularly if the driving times are relatively comparable. As mentioned previously, the fuel consumption and cost data for each route need not be displayed in a table; it can be shown in any other suitable format for viewing by the driver.

With fuel consumption and navigation route data available, a navigation system can provide additional useful information to a driver. For example, on a long distance drive, the navigation system can estimate when refueling of the vehicle will be required, and can indicate on the display 410 where fuel stations exist. The fuel station location data is obtained from the point of interest data provider 152 discussed previously. The navigation system can also comprehend the price of fuel at the fuel stations along the different routes (available from the POI data provider 152), and factor this into the data provided in the display 470. For example, the route 40 may travel through a state with a much higher fuel tax than the route 60. Local supply and demand can also cause large differences in fuel prices between locations. Thus, the average price per unit volume of fuel may be 15% higher along the route 40 than along the route 60. The route-specific fuel purchase price can be multiplied by the estimated fuel consumption to provide very accurate estimates of fuel cost for each route, which may be the determining factor for many drivers.

A navigation system which provides estimated fuel consumption and fuel cost for different navigation routing options gives the driver valuable information to use when selecting a driving route. Selection of driving routes which use less fuel results in savings for the individual driver, and provides a societal benefit as well.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for providing estimated fuel consumption for a driving route in a vehicle navigation system, said method comprising:

providing vehicle operational data from a plurality of road vehicles to a server computer, where the vehicle operational data is collected by sensors on the road vehicles and provided wirelessly to the server computer, and the vehicle operational data includes data characterizing each of the road vehicles driving over one or more road segments including fuel consumption for each of the road vehicles for each of the road segments;

creating one or more fuel consumption models on the server computer, where the one or more fuel consumption models compute fuel consumption for each of the road vehicles for each of the road segments based on the vehicle operational data, properties of road segments, and behavior characteristics of drivers;

requesting navigation instructions from a start point to a destination by an occupant of a host vehicle using a navigation system in the host vehicle;

determining one or more driving routes from the start point to the destination;

computing an estimated fuel consumption and a fuel cost for the host vehicle to drive each of the one or more driving routes, using the one or more fuel consumption models; and displaying the one or more driving routes, with the fuel consumption and the fuel cost for each of the one or more driving routes on the navigation system.

2. The method of claim 1 wherein the vehicle operational data includes vehicle and engine model, road grade, traffic flow speed, individual vehicle acceleration/braking patterns, individual vehicle deviation from average traffic speed, and idling caused by stop signs, traffic lights and congestion.

3. The method of claim 2 wherein the vehicle operational data also includes elevation and outside air temperature.

4. The method of claim 1 wherein the one or more fuel consumption models include a vehicle kinematic physics-based model which simulates vehicle forces and motions in order to compute fuel consumption for a road segment.

5. The method of claim 4 wherein the vehicle kinematic physics-based model includes, for each road segment, a vehicle dynamic profile which simulates vehicle motion as a function of time for the road segment, an engine speed profile computed based on the vehicle dynamic profile, and an engine torque profile computed based on the vehicle dynamic profile and forces affecting the vehicle, and estimates fuel consumption for the road segment by computing a time integral of the engine speed profile and the engine torque profile.

6. The method of claim 1 wherein the one or more fuel consumption models include a machine learning model which correlates the vehicle operational data to fuel consumption for each of the road segments.

7. The method of claim 6 wherein the machine learning model is a neural network model, and the neural network model includes a training mode in which it is calibrated using the vehicle operational data and the fuel consumption data from the plurality of road vehicles, and a testing mode in which it predicts fuel consumption for the host vehicle.

8. The method of claim 6 wherein the machine learning model is a statistical learning model, and the statistical learning model includes a training mode in which it is calibrated using the vehicle operational data and the fuel consumption data from the plurality of road vehicles, and a testing mode in which it predicts fuel consumption for the host vehicle.

9. The method of claim 1 wherein computing an estimated fuel consumption and a fuel cost is performed by the server computer, and the estimated fuel consumption and the fuel cost are downloaded to the navigation system in the host vehicle.

10. The method of claim 1 wherein computing an estimated fuel consumption and a fuel cost is performed by the navigation system in the host vehicle, using the one or more fuel consumption models downloaded from the server computer to the navigation system.

11. The method of claim 1 further comprising receiving map data, point of interest (POI) data and real-time traffic data from supplemental data providers, by the server computer, incorporating the map data and the real-time traffic data into the fuel consumption models, and incorporating the POI data into the driving route and fuel cost displayed on the navigation system.

12. The method of claim 11 further comprising providing updated data to the supplemental data providers by the server computer.

13. A method for providing estimated fuel consumption for a driving route in a vehicle navigation system, said method comprising:

providing vehicle operational data from a plurality of road vehicles to a server computer, where the vehicle operational data is collected by sensors on the road vehicles and provided wirelessly to the server computer, and the vehicle operational data includes data characterizing each of the road vehicles driving over one or more road segments including fuel consumption for each of the road vehicles for each of the road segments, where the vehicle operational data includes vehicle and engine model, road grade, traffic flow speed, individual vehicle acceleration/braking patterns, individual vehicle deviation from average traffic speed, idling caused by stop signs, traffic lights and congestion, elevation and outside air temperature;

receiving map data, point of interest (POI) data and real-time traffic data from supplemental data providers, by the server computer;

creating a plurality of fuel consumption models on the server computer, where the fuel consumption models compute fuel consumption for each of the road vehicles for each of the road segments based on the vehicle operational data, properties of road segments, behavior characteristics of drivers and the data from the supplemental data providers, and where the fuel consumption models include a vehicle kinematic physics-based model which simulates vehicle forces and motions in order to compute fuel consumption for a road segment and a machine learning model which correlates the vehicle operational data to fuel consumption for each of the road segments;

requesting navigation instructions from a start point to a destination by an occupant of a host vehicle using a navigation system in the host vehicle;

determining one or more driving routes from the start point to the destination;

computing an estimated fuel consumption and a fuel cost for the host vehicle to drive each of the one or more driving route using the plurality of fuel consumption models; and displaying the one or more driving routes, with the fuel consumption, the fuel cost and POI data for each of the one or more driving routes on the navigation system.

14. A system for providing estimated fuel consumption for a driving route in a vehicle navigation system, said system comprising:

a server computer including a processor and a memory, said server computer being configured to receive operational data from a plurality of vehicles being driven over a plurality of road segments, and further configured to compute one or more fuel consumption models which calculate fuel consumption for each of the vehicles driving each of the road segments based on the operational data, properties of road segments, and behavior characteristics of drivers; and a navigation system in a host vehicle, said navigation system being configured to wirelessly communicate with the server computer, where an occupant of the host vehicle uses the navigation system to make a request for navigation instructions from a start point to a destination, one or more navigation routing options are determined in response to the request, and an estimated fuel consumption for each of the routing options is calculated using the one or more fuel consumption models and is provided to the occupant of the host vehicle.

15. The system of claim 14 wherein the operational data includes vehicle and engine model, road grade, traffic flow speed, individual vehicle acceleration/braking patterns, individual vehicle deviation from average traffic speed, and idling caused by stop signs, traffic lights and congestion.

16. The system of claim 15 wherein the operational data also includes elevation and outside air temperature.

17. The system of claim 14 wherein the one or more fuel consumption models include a vehicle kinematic physics-based model which simulates vehicle forces and motions in order to compute fuel consumption for a road segment.

18. The system of claim 17 wherein the vehicle kinematic physics-based model includes, for each road segment, a vehicle dynamic profile which simulates vehicle motion as a function of time for the road segment, an engine speed profile computed based on the vehicle dynamic profile, and an engine torque profile computed based on the vehicle dynamic profile and forces affecting the vehicle, and estimates fuel consumption for the road segment by computing a time integral of the engine speed profile and the engine torque profile.

19. The system of claim 14 wherein the one or more fuel consumption models include a machine learning model which correlates the operational data to fuel consumption for each of the road segments.

20. The system of claim 19 wherein the machine learning model is a neural network model, and the neural network model includes a training mode in which it is calibrated using the operational data and the fuel consumption data from the plurality of road vehicles, and a testing mode in which it predicts fuel consumption for the host vehicle.

21. The system of claim 19 wherein the machine learning model is a statistical learning model, and the statistical learning model includes a training mode in which it is calibrated using the operational data and the fuel consumption data from the plurality of road vehicles, and a testing mode in which it predicts fuel consumption for the host vehicle.

22. The system of claim 14 wherein computing an estimated fuel consumption and a fuel cost is performed by the server computer, and the estimated fuel consumption and the fuel cost are downloaded to the navigation system in the host vehicle.

23. The system of claim 14 wherein computing an estimated fuel consumption and a fuel cost is performed by the navigation system in the host vehicle, using the one or more fuel consumption models downloaded from the server computer to the navigation system.

24. The system of claim 14 further comprising receiving map data, point of interest (POI) data and real-time traffic data from supplemental data providers, by the server computer, incorporating the map data and the real-time traffic data into the fuel consumption models, and incorporating the POI data into the driving route and fuel cost displayed on the navigation system.

25. The system of claim 24 further comprising providing updated data to the supplemental data providers by the server computer.

* * * * *